United States Patent
Chang et al.

(10) Patent No.: US 12,260,318 B2
(45) Date of Patent: Mar. 25, 2025

(54) MULTIPLY ACCUMULATE CIRCUIT FOR BINARY NEURAL NETWORK SYSTEM

(71) Applicant: eMemory Technology Inc., Hsin-Chu (TW)

(72) Inventors: Chia-Fu Chang, Hsinchu County (TW); Cheng-Heng Chung, Hsinchu County (TW); Ching-Yuan Lin, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 1072 days.

(21) Appl. No.: 17/141,333

(22) Filed: Jan. 5, 2021

(65) Prior Publication Data

US 2021/0248452 A1   Aug. 12, 2021

Related U.S. Application Data

(60) Provisional application No. 62/975,671, filed on Feb. 12, 2020.

(51) Int. Cl.
  *G11C 11/54* (2006.01)
  *G06N 3/04* (2023.01)
  (Continued)

(52) U.S. Cl.
  CPC .............. *G06N 3/063* (2013.01); *G06N 3/04* (2013.01); *G11C 11/54* (2013.01);
  (Continued)

(58) Field of Classification Search
  CPC .......... G06N 3/063; G06N 3/04; G06N 3/065; G11C 11/54; H01L 23/5226; H10B 20/20;
  (Continued)

(56) References Cited

U.S. PATENT DOCUMENTS

2019/0042949 A1  2/2019  Young et al.
2019/0080755 A1  3/2019  Seo et al.
(Continued)

FOREIGN PATENT DOCUMENTS

| CN | 110378475 A | 10/2019 | |
|----|----|----|----|
| KR | 20190133532 A | * 12/2019 | ............. G06N 3/063 |
| WO | WO2019049842 A1 | 3/2019 | |

OTHER PUBLICATIONS

Fang Su et al., A462GOPs/J RRAM-Based Nonvolatile Intelligent Processor for Engery Harvesting IoE System Featuring Nonvolatile Logics and Processing-In-Memory, Jun. 2017, IEEE 2017 Symposium on VLSI Circuits (Year: 2017).*

(Continued)

*Primary Examiner* — Jay W. Radke
(74) *Attorney, Agent, or Firm* — WPAT, PC

(57) ABSTRACT

A multiply accumulate circuit receives m one-bit neuron values from a first layer of a neural network system. The multiply accumulate circuit includes m non-volatile memory cells and m current sources. In addition, m current paths are defined by the m non-volatile memory cells and the m current sources collaboratively. A first current path is defined by a first non-volatile memory cell and a first current source. A first terminal of the first current source receives a first supply voltage. A second terminal of the first current source is connected with a first terminal of the first non-volatile memory cell. A second terminal of the first non-volatile memory cell is connected with an output terminal of the multiply accumulate circuit. A control terminal of the first current source receives a first one-bit neuron value.

11 Claims, 8 Drawing Sheets

(51) Int. Cl.
  *G06N 3/063* (2023.01)
  *H01L 23/522* (2006.01)
  *H10B 63/00* (2023.01)
  *H10N 70/00* (2023.01)
  *H10B 20/20* (2023.01)
  *H10B 20/25* (2023.01)

(52) U.S. Cl.
  CPC ......... *H01L 23/5226* (2013.01); *H10B 63/30* (2023.02); *H10N 70/041* (2023.02); *H10N 70/8833* (2023.02); *H10B 20/20* (2023.02); *H10B 20/25* (2023.02)

(58) Field of Classification Search
  CPC ...... H10B 63/30; H10B 20/27; H10N 70/041; H10N 70/8833; Y02D 10/00; G05F 1/56
  See application file for complete search history.

(56) References Cited

U.S. PATENT DOCUMENTS

| | | | |
|---|---|---|---|
| 2019/0236445 A1 | 8/2019 | Das et al. | |
| 2020/0202204 A1* | 6/2020 | Kouno | G11C 11/1673 |
| 2021/0117499 A1* | 4/2021 | Qin | G11C 11/1657 |

OTHER PUBLICATIONS

Office Action issued by CNIPA on Mar. 22, 2022.
Office Action issued by Taiwan Intellectual Property Office on Jan. 28, 2022.

\* cited by examiner

MULTIPLY ACCUMULATE CIRCUIT FOR BINARY NEURAL NETWORK SYSTEM

This application claims the benefit of U.S. provisional application Ser. No. 62/975,671, filed Feb. 12, 2020, the subject matters of which are incorporated herein by reference.

APPLIED TO FIELD OF THE INVENTION

The present invention relates to a circuit for a neural network system, and more particularly to a multiply accumulate circuit for a binary neural network system.

BACKGROUND OF THE INVENTION

Recently, a neural network system has been widely applied to many AI application systems to provide the intelligent processing capability such as the pattern recognition capability, the data classification capability and the object detection capability. Hereinafter, a neural network system for recognizing numbers will be described.

FIG. 1 is a schematic diagram illustrating the architecture of a neural network system for recognizing numbers. The neural network system 100 is used for recognizing the handwritten numbers on a handwriting board 102. The handwriting board 102 is composed of 784 (=28×28) sensing points.

As shown in FIG. 1, the neural network system 100 comprises an input layer 110, a hidden layer 120 and an output layer 130. Generally, each sensing point on the handwriting board 102 corresponds to an input neuron of the input layer. Consequently, the input layer 110 comprises 784 (=28×28) input neurons $I_0 \sim I_{783}$. It means that the size of the input layer 110 is 784.

Since the neural network system 100 has to recognize ten numbers 0~9, the output layer 130 comprises ten output neuron $O_0 \sim O_9$. It means that the size of the output layer 130 is 10.

The hidden layer 120 of the neural network system 100 comprises 30 neurons $H_0 \sim H_{29}$. That is, the size of the hidden layer 120 is 30. Consequently, the size of the neural network system 100 is indicated as 784–30–10.

Each connection line between the input layer 110 and the hidden layer 120 denotes a neuron connection weight. Similarly, each connection line between the hidden layer 120 and the output layer 130 also denotes a neuron connection weight. Please refer to FIG. 1. The neuron connection weights between the 784 input neurons $I_0 \sim I_{783}$ of the input layer 110 and the neuron $H_0$ of the hidden layer 120 are indicated as $IH_{0,0} \sim IH_{783,0}$. Similarly, the neuron connection weights between the 784 input neurons $I_0 \sim I_{783}$ of the input layer 110 and the 30 neurons $H_0 \sim H_{29}$ of the hidden layer 120 are indicated as $IH_{0,0} \sim IH_{783,0}$ and $(IH_{0,1} \sim IH_{783,1}) \sim (IH_{0,29} \sim IH_{783,29})$. Consequently, there are 734×30 neuron connection weights between the input layer 110 and the hidden layer 120.

The 30 neurons $H_0 \sim H_{29}$ of the hidden layer 120 are connected with the ten output neurons $O_0 \sim O_9$ of the output layer 130. Consequently, 30×10 neuron connection weights between the neurons $H_0 \sim H_{29}$ of the hidden layer 120 and the output neuron $O_0 \sim O_9$ of the output layer 130 are indicated as $(HO_{0,0} \sim HO_{29,0}) \sim (HO_{0,9} \sim HO_{29,9})$. Moreover, the neuron connection weights $(IH_{0,0} \sim IH_{783,0}) \sim (IH_{0,29} \sim IH_{783,29})$ and $(HO_{0,0} \sim HO_{29,0}) \sim (HO_{0,9} \sim HO_{29,9})$ are collaboratively combined as a weight group.

After the values of the neurons of the previous layer are multiplied by the corresponding neuron connection weights and accumulated, the neuron values for input to the next layer are acquired. Take the neuron value $H_0$ of the hidden layer 120 for example. The neuron value $H_0$ of the hidden layer 120 is calculated by the following formula:

$$H_0 = I_0 \times IH_{0,0} + I_1 \times IH_{1,0} + \ldots + I_{783} \times IH_{783,0} = \sum_{i=0}^{783} I_i \times IH_{i,0}$$

The other neuron values $H_1 \sim H_{29}$ of the hidden layer 120 are also calculated by the above formula.

Similarly, the output neuron value $O_0$ of the output layer 130 is calculated by the following formula:

$$O_0 = \sum_{j=0}^{29} H_j \times HO_{j,0}$$

The other neuron values $O_0 \sim O_9$ of the output layer 130 are also calculated by the above formula.

Before the practical applications of the neural network system 100, the neural network system 100 has to be in a training phase to acquire the values of all neuron connection weights in the weight group. After all neuron connection weights in the weight group are acquired through many iterations of training, the well-trained neural network system 100 is established.

In an application phase, the number written on the handwriting board 102 can be recognized by the neural network system 100. As shown in FIG. 1, the number "7" is written on the handwriting board 102. Since the neuron $O_7$ of the output layer 130 has the highest value, the number "7" is recognized by the neural network system 100.

The example of the neural network system 100 as shown in FIG. 1 is presented herein for purpose of illustration and description only. In case that the neural network system is more complicated, the neural network system comprises plural hidden layers to increase the recognition capability. Moreover, the sizes of the hidden layers are not restricted.

Since the multiplication operation and the accumulation operation have to be performed on the neural network system continuously, the use of a computer system can execute the calculations about the multiplication operation and the accumulation operation. For example, all neuron connection weights are stored in the memory of the computer system. Then, a central processing unit (CPU) in the computer system accesses the neuron connection weights from the memory. After the multiplication operation and the accumulation operation are performed according to the neuron connection weights, all neuron values are acquired.

However, as the size of the neural network system is gradually increased, it is necessary to increase the storage capacity of the memory to store the neuron connection weights and the neuron values. Moreover, since the central processing unit has to access the data from the memory, the performance of the computer system is largely reduced and the power consumption of the computer system is increased.

Nowadays, according to the characteristics of the neural network system, a multiply accumulate circuit (also abbreviated as MAC) has been disclosed to calculate the neuron values.

Please refer to FIGS. 2A, 2B and 2C. FIG. 2A is a schematic diagram illustrating the architecture of a conventional multiply accumulate circuit. FIG. 2B is a schematic circuit diagram illustrating a MAC group with plural multiply accumulate circuits. FIG. 2C is a schematic block diagram illustrating a control circuit.

In FIG. 2A, the conventional multiply accumulate circuit 200 is shown. After the input values $X_1 \sim X_m$ are multiplied by the corresponding weights $W_{1,j} \sim W_{m,j}$ and the products are accumulated, the output value $Y_j$ is acquired according to the following formula:

$$Yj = \sum_{i=1}^{m} X_i \times W_{i,j}$$

When the multiply accumulate circuit 200 is applied to the neural network system, the weights $W_{1,j} \sim W_{m,j}$ of the multiply accumulate circuit 200 are the neuron connection weights. Moreover, the input values are the neuron values of the previous layer, and the output value $Y_j$ is the neuron value for input to the next layer.

As shown in FIG. 2B, the MAC group 250 comprises plural multiply accumulate circuits 251~25j. The MAC group 250 is used to calculate the size m of the previous layer and the size j of the next layer in the neural network system.

Take the multiply accumulate circuit 251 for example. The multiply accumulate circuit 251 comprises m electrical conductance elements. The m electrical conductance elements have the conductance values $G_{1,1} \sim G_{m,1}$, respectively. Each electrical conductance element comprises a variable resistor. After the resistance value of the variable resistor is tuned, the reciprocal of the resistance value is the conductance value. For example, if the tuned resistance value is 5 ohms ($\Omega$), the conductance value is 0.2 siemens (S). In addition, the conductance values $G_{1,1} \sim G_{m,1}$ are tuned according to the neuron connection weights of the neural network system.

Moreover, the m input terminals of the multiply accumulate circuit 251 receive m input voltages V1~Vm, respectively. The voltage values of the input voltages V1~Vm denote the neuron values of the previous layer. The output terminal of the multiply accumulate circuit 251 generates an output current I1. The output current I1 denotes the neuron value for input to the next layer. The electrical conductance elements $G_{1,1} \sim G_{m,1}$ are connected between the m input terminals and the output terminal of the multiply accumulate circuit 251. The structure of each of the multiply accumulate circuits 252~25j is similar to the structure of the multiply accumulate circuit 251, and is not redundantly described herein.

In a training phase of the neural network system, the m×j conductance values $G_{1,1} \sim G_{m,j}$ of the multiply accumulate circuits 251~25j are used as m×j neuron connection weights.

In an application phase of the neural network system, the input terminals of the multiply accumulate circuits 251~25j receive the m input voltages V1~Vm, and the output terminals of the multiply accumulate circuits 251~25j are connected with a ground voltage (not shown). Consequently, the output currents I1~Ij from the multiply accumulate circuits 251~25j denote the j neuron values for input to the next layer.

For example, after the conductance values $G_{1,1} \sim G_{m,1}$ of the multiply accumulate circuit 251 receive the m input voltages V1~Vm, m currents $I_{1,1} \sim I_{m,1}$ are generated. The m currents $I_{1,1} \sim I_{n,1}$ are superposed into an output current I1 according to the following formula:

$$I1 = \sum_{i=1}^{m} I_{i,1} = \sum_{i=1}^{m} Vi \times G_{i,1}$$

As shown in FIG. 2C, the control circuit 290 comprises a digital-to-analog converter (DAC) 260, the MAC group 250 and an analog-to-digital converter (ADC) 270. The digital-to-analog converter 260 is used for converting digital values into analog voltages. The analog-to-digital converter 270 is used for converting analog currents into digital values.

Firstly, the m neuron values Din_1~Din_m of the previous layer are inputted into the digital-to-analog converter 260 and converted into the corresponding m input voltages V1~Vm. Then, the MAC group 250 receives the m input voltages V1~Vm and generates j output currents I1~Ij. Then, the j output currents I1~Ij are received by the analog-to-digital converter 270 and converted into j neuron values Do_1~Do_j for input to the next layer. The neuron values Din_1~Din_m and the neuron values Do_1~Do_j are digital values.

In other words, the neural network system of any size can be implemented with the control circuit 290 of FIG. 2C. For example, the size of the neural network system 100 as shown in FIG. 1 is indicated as 784–30–10. Consequently, the neural network system 100 comprises two control circuits. The first control circuit receives the 784 neuron values $I_0 \sim I_{783}$ of the input layer 110 and generates the 30 neuron values $H_0 \sim H_{29}$ of the hidden layer 120. The second control circuit receives the 30 neuron values $H_0 \sim H_{29}$ of the hidden layer 120 and generates the output neuron $O_0 \sim O_9$ of the output layer 130.

In FIGS. 2B and 2C, the neuron values Din_1~Din_m and the neuron values Do_1~Do_j are multi-bit digital values, and the corresponding conductance values $G_{1,1} \sim G_{m,1}$ are adjusted according to the neuron connection weights of the multi-bit digital values.

Recently, a binary neural network system has gradually received attention. The neuron values and the neuron connection weights of the binary neural network system are one-bit binary codes. In comparison with the neural network system of FIGS. 1 and 2B, the process of calculating the neuron values and the neuron connection weights is simplified. By using the binary neural network system, the storage space of the memory is effectively decreased, the computation amount of the computer system is reduced, and the power consumption is reduced.

SUMMARY OF THE INVENTION

An embodiment of the present invention provides a multiply accumulate circuit. The multiply accumulate circuit receives m one-bit neuron values from a first layer of a neural network system. The multiply accumulate circuit includes m non-volatile memory cells and m current sources. In addition, m current paths are defined by the m non-volatile memory cells and the m current sources collaboratively. The m current paths are connected between a first supply voltage and an output terminal of the multiply accumulate circuit. A first current path of the m current paths is defined by a first non-volatile memory cell of the m non-volatile memory cells and a first current source of the m current sources. A first terminal of the first current source receives the first supply voltage. A second terminal of the first current source is connected with a first terminal of the first non-volatile memory cell. A second terminal of the first non-volatile memory cell is connected with the output terminal of the multiply accumulate circuit. A control terminal of the first current source receives a first one-bit neuron value of the m neuron values from the first layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
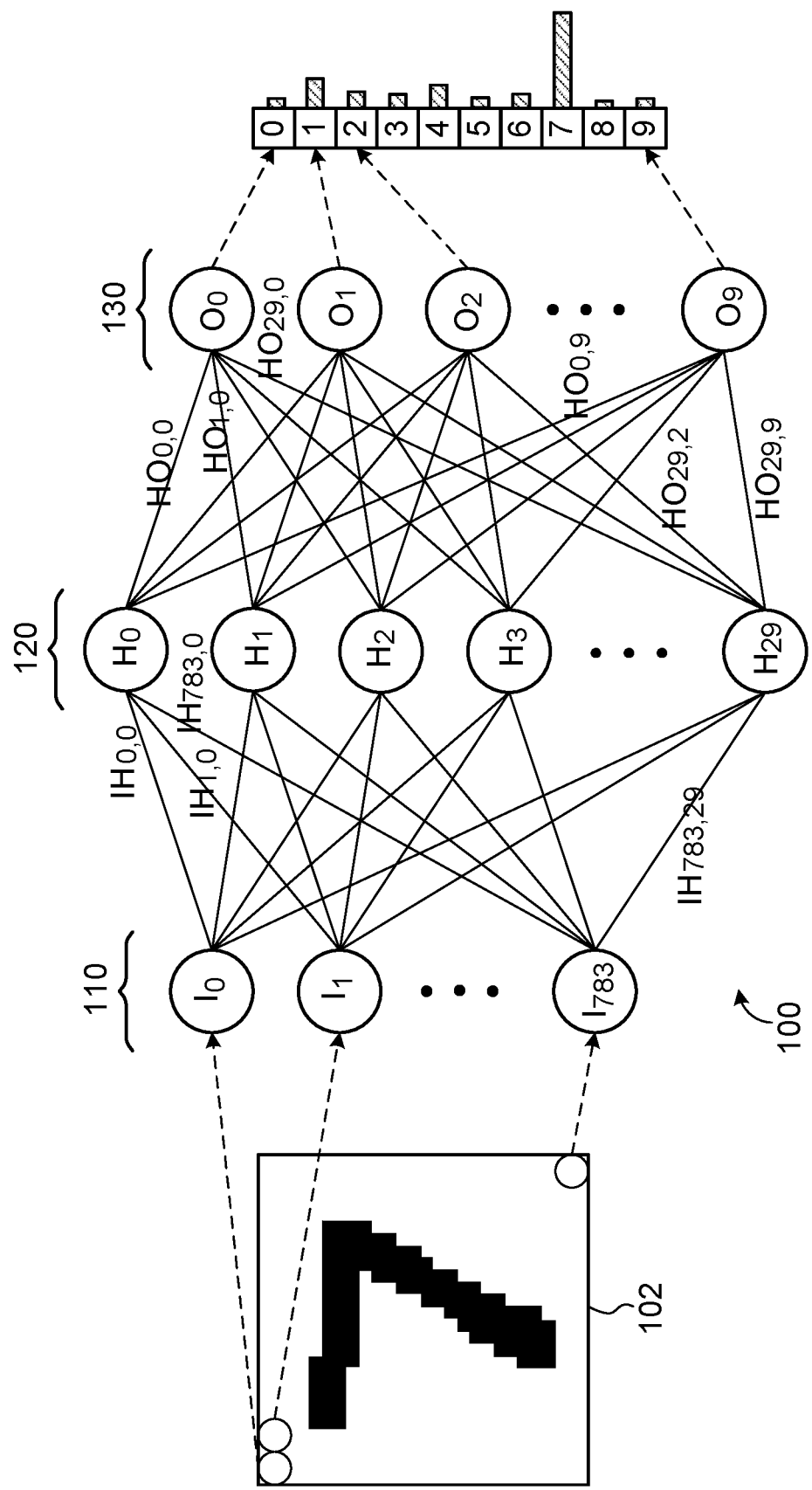
FIG. 1 (prior art) is a schematic diagram illustrating the architecture of a neural network system for recognizing numbers.
Figure 2A:
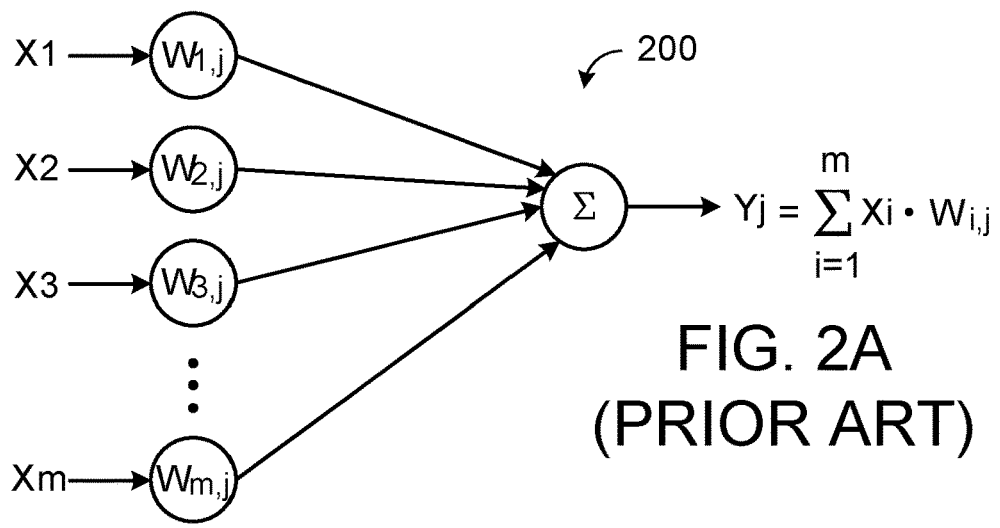
FIG. 2A (prior art) is a schematic diagram illustrating the architecture of a conventional multiply accumulate circuit.
Figure 2B:
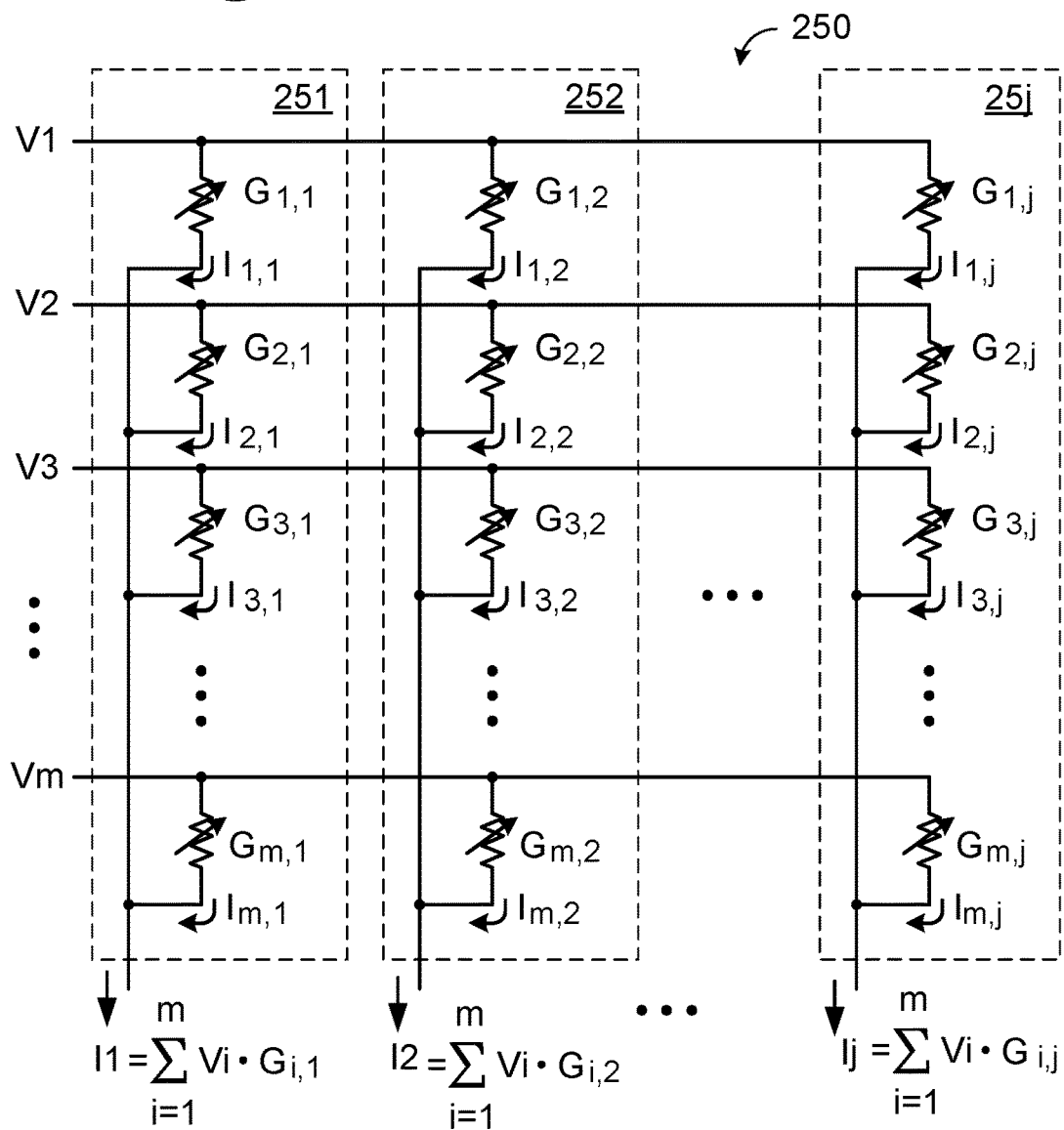
FIG. 2B (prior art) is a schematic circuit diagram illustrating a MAC group with plural multiply accumulate circuits.
Figure 2C:
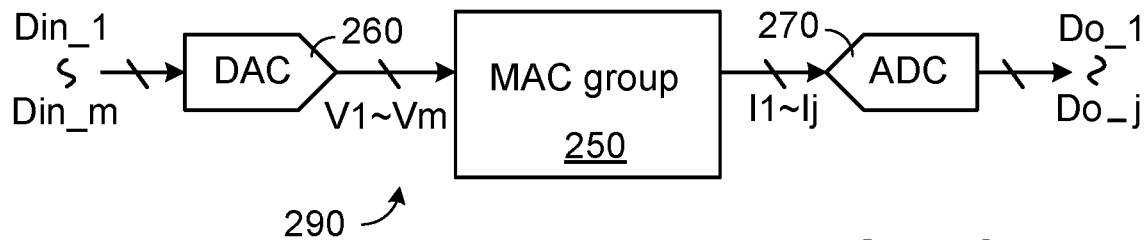
FIG. 2C (prior art) is a schematic block diagram illustrating a control circuit.

The present invention provides a multiply accumulate circuit for a binary neural network system. In the multiply accumulate circuit, non-volatile memory cells are used for recording the neuron connection weights. In addition, the multiply accumulate circuit comprises current sources.

As known, the non-volatile memories are classified into multi-time programming memory cells (also referred as MTP memory cells), one time programming memory cells (also referred as OTP memory cells) and mask read only memory cells (also referred as Mask ROM cells). For example, the memory cells of a resistive random access memory (also abbreviated as RRAM or ReRAM) may be used as the MTP memory cells. For example, a memory cell with a floating gate transistor may be used as the MTP memory cell or the OTP memory cell, and the memory cell with an antifuse transistor may be used as the OTP memory cell.

By providing proper bias voltages to the MTP memory cell or the OTP memory cell, the memory cell may be selectively in one of two different storage states. Moreover, the Mask ROM cell is fabricated to be in one of two different storage states through a semiconductor manufacturing process.

Take the OTP memory cell with the antifuse transistor for example. In case that the gate oxide layer of the antifuse transistor is not ruptured, the antifuse transistor has a high resistance value of several mega ohms (MΩ). Under this circumstance, the memory cell is in a first storage state. Whereas, in case that the gate oxide layer of the antifuse transistor is ruptured, the antifuse transistor has a low resistance value of several kilo ohms (kΩ). Under this circumstance, the memory cell is in a second storage state. In other words, during a program action, a proper bias voltage is provided to program the OTP memory cell to be in one of the first storage state and the second storage state.

Similarly, before the ReRAM memory cell undergoes a programming action, the ReRAM memory cell has a high resistance value of several mega ohms (MΩ). Under this circumstance, the memory cell is in a first storage state. Whereas, after the ReRAM memory cell undergoes the programming action, the ReRAM memory cell has a low resistance value of several kilo ohms (kΩ). Under this circumstance, the memory cell is in a second storage state. In other words, the ReRAM memory cell may be selectively subjected to the programming action so as to be in one of the first storage state and the second storage state.

As mentioned above, by providing proper bias voltages, the non-volatile memory cell may be selectively in the first storage state corresponding to the high resistance value or the second storage state corresponding to the low resistance value. The high resistance value is at least 1000 times the low resistance value. In this context, the first storage state corresponding to the high resistance value is referred as an off state, and the second storage state corresponding to the low resistance value is referred as an on state.

According to the present invention, the multiply accumulate circuit for the binary neural network system comprises the non-volatile memory cells and current sources. Each of the non-volatile memory cells is in one of two different storage states.

Figure 3:
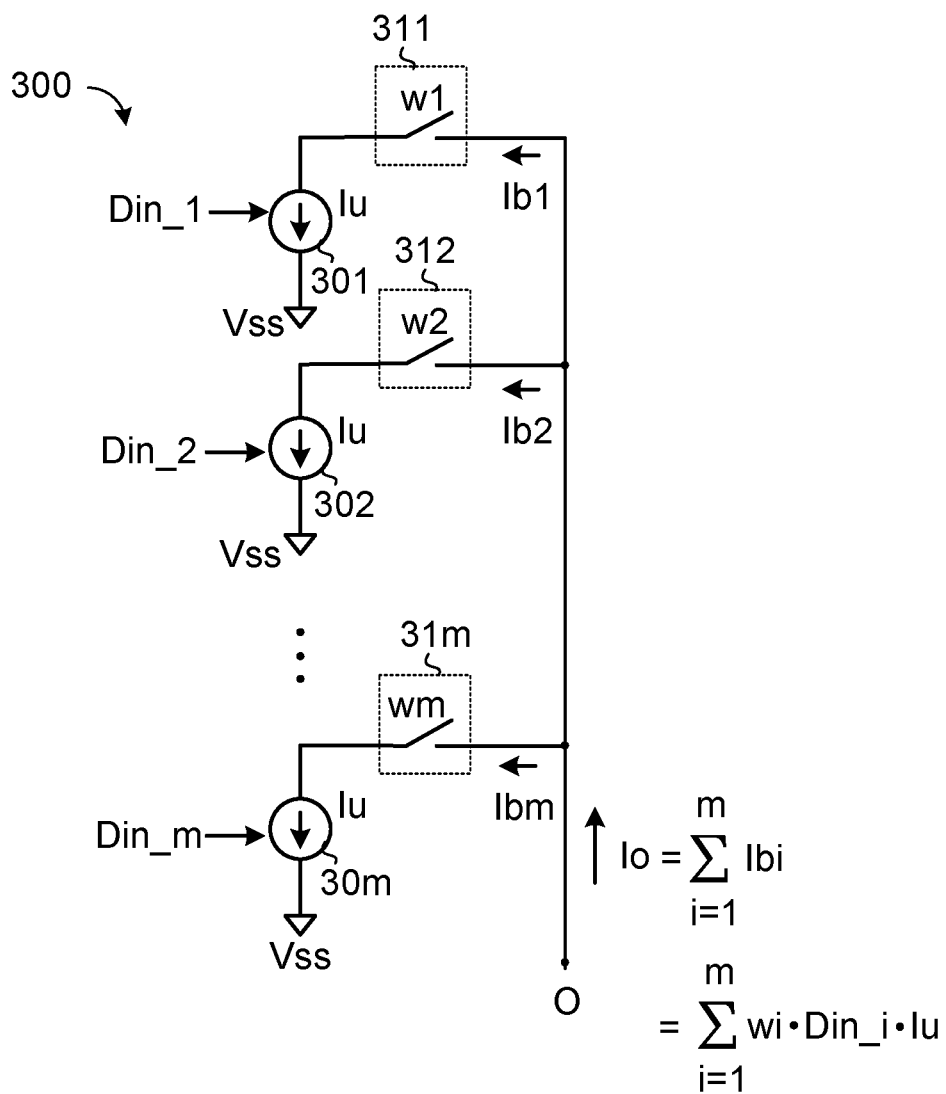
FIG. 3 is a schematic circuit diagram illustrating a multiply accumulate circuit according to a first embodiment of the present invention.

FIG. 3 is a schematic circuit diagram illustrating a multiply accumulate circuit according to a first embodiment of the present invention. The multiply accumulate circuit 300 comprises m current sources 301~30m and m non-volatile memory cells 311~31m. The m input terminals of the multiply accumulate circuit 300 receive m one-bit neuron values Din_1~Din_m of the previous layer, respectively. In addition, the m current sources 301~30m are controlled according to the m neuron values Din_1~Din_m. When any of the current sources 301~30m is activated, a current Iu is generated. For example, the magnitude of the current Iu is equal to 0.1 µA.

The multiply accumulate circuit 300 comprises m current paths. Each current path is defined by one current source and the corresponding non-volatile memory cell. The first current path is defined by the current source 301 and the non-volatile memory cell 311. The current source 301 is controlled according to the neuron value Din_1. The first terminal of the current source 301 receives a first supply voltage Vss. The second terminal of the current source 301 is connected with the first terminal of the non-volatile memory cell 311. The second terminal of the non-volatile memory cell 311 is connected with an output terminal O of the multiply accumulate circuit 300. The second current path is defined by the current source 302 and the non-volatile memory cell 312. The current source 302 is controlled according to the neuron value Din_2. The first terminal of the current source 302 receives the first supply voltage Vss. The second terminal of the current source 302 is connected with the first terminal of the non-volatile memory cell 312. The second terminal of the non-volatile memory cell 312 is connected with the output terminal O of the multiply accumulate circuit 300. The rest may be deduced by analog. The m-th current path is defined by the current source 30m and the non-volatile memory cell 31m. The current source 30m is controlled according to the neuron value Din_m. The first terminal of the current source 30m receives the first supply voltage Vss. The second terminal of the current source 30m is connected with the first terminal of the non-volatile memory cell 31m. The second terminal of the non-volatile memory cell 31m is connected with the output terminal O of the multiply accumulate circuit 300.

The non-volatile memory cells 311~31m can store one-bit neuron connection weights w1~wm, respectively. The non-volatile memory cells 311~31m are MTP memory cells, OTP memory cells or Mask ROM cells. The operations of the non-volatile memory cells 311~31m are similar to switches. For example, when the non-volatile memory cell is in the off state, the resistance value is very large, and the current cannot flow through the non-volatile memory cell. Under this circumstance, the neuron connection weight is considered as a logic value "0". When the non-volatile memory cell is in the on state, the resistance value is lower, and the current can flow through the non-volatile memory cell. Under this circumstance, the neuron connection weight is considered as a logic value "1".

In an application phase of the multiply accumulate circuit 300, the output terminal O of the multiply accumulate circuit 300 receives a second supply voltage Vdd. The magnitude of the second supply voltage Vdd is higher than the magnitude of the first supply voltage Vss. For example, the second supply voltage Vdd is 3.3V, and the first supply voltage Vss is equal to a ground voltage.

In the application phase of the multiply accumulate circuit 300, the output terminal O of the multiply accumulate circuit 300 generates an output current $I_O$ according to the m one-bit neuron values Din_1~Din_m of the previous layer and the one-bit neuron connection weights w1~wm in the non-volatile memory cells 311~31m.

The operation of the first current path will be described as follows. In case that the neuron connection weight w1 stored in the non-volatile memory cell 311 has the logic value "0", the current Ib1 flowing through the first current path is zero regardless of whether the current source 301 is activated. In case that the neuron connection weight w1 stored in the non-volatile memory cell 311 has the logic value "1" and the neuron value Din_1 has the logic value "0", the current source 301 is inactivated and unable to generate the current. Under this circumstance, the current Ib1 flowing through the first current path is zero. In case that the neuron connection weight w1 stored in the non-volatile memory cell 311 has the logic value "1" and the neuron value Din_1 has the logic value "1", the current source 301 is activated to generate the current Iu. Under this circumstance, the current Ib1 flowing through the first current path is equal to the current Iu. The operations of the other current paths are similar to the first current path, and not redundantly described herein.

The output current $I_O$ from the output terminal O of the multiply accumulate circuit 300 in the application phase may be expressed by the following mathematic formula:

$$Io = \sum_{i=1}^{m} Ibi = \sum_{i=1}^{m} wi \cdot \text{Din\_i} \cdot Iu$$

In the above mathematic formula, wi and Din_i are one-bit binary codes. After the output current Io is digitalized, a one-bit neuron value for input to the next layer is obtained. For example, if the output current Io is higher than a reference current, the one-bit neuron value for input to the next layer has the logic value "1". Whereas, if the output current Io is lower than the reference current, the one-bit neuron value for input to the next layer has the logic value "0".

Figure 4:
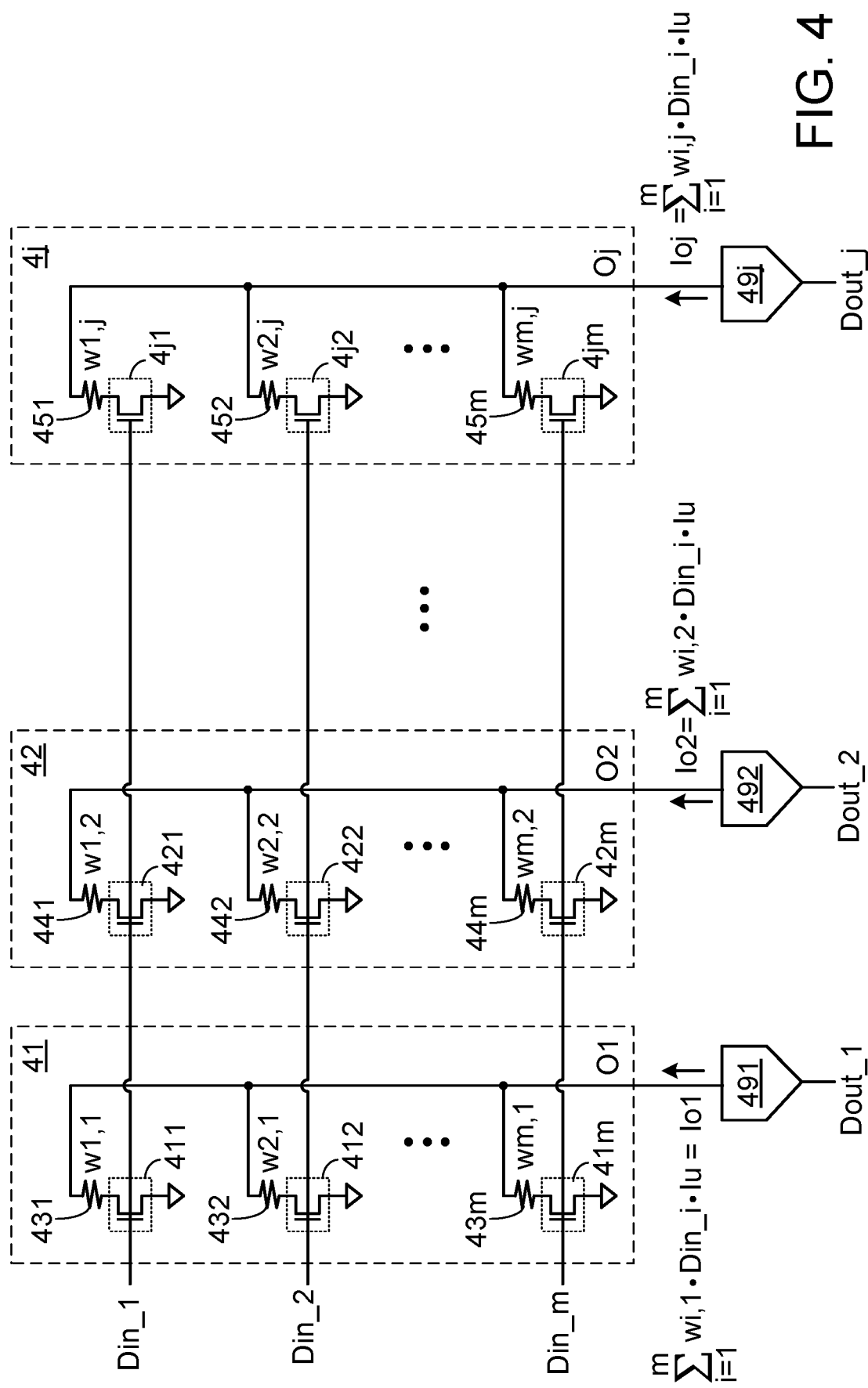
FIG. 4 is a schematic circuit diagram illustrating a MAC group with plural multiply accumulate circuits according to a second embodiment of the present invention.

Moreover, plural multiply accumulate circuits can be combined as a multiply accumulate circuit group (also abbreviated as a MAC group). The circuitry for implementing the multiply accumulate circuit will be described as follows. FIG. 4 is a schematic circuit diagram illustrating a MAC group with plural multiply accumulate circuits according to a second embodiment of the present invention.

The MAC group comprises j multiply accumulate circuits 41~4j. The multiply accumulate circuits 41~4j generate corresponding output currents Io1~Ioj, respectively. The circuitry structures of the multiply accumulate circuits 41~4j are identical. For brevity, only the multiply accumulate circuits 41 will be described.

The multiply accumulate circuit 41 comprises m current sources 411~41m and m non-volatile memory cells 431~43m. The m input terminals of the multiply accumulate circuit 41 receive m one-bit neuron values Din_1~Din_m of the previous layer, respectively. In addition, the m current sources 411~41m are controlled according to the m neuron values Din_1~Din_m. The multiply accumulate circuit 41 comprises m current paths. Each current path is defined by one current source and the corresponding non-volatile memory cell. The connecting relationships between these m current paths are similar to those of the multiply accumulate circuit 300 of the first embodiment, and not redundantly described herein.

In this embodiment, the current sources 411~41m of the multiply accumulate circuit 41 are implemented with n-type transistors. The sizes of the n-type transistors are identical. When any of the n-type transistors is turned on, a current Iu is generated.

In the current source 411, the gate terminal of the n-type transistor receives the one-bit neuron value Din_1, the first drain/source terminal of the n-type transistor receives the first supply voltage, and the second drain/source terminal of the n-type transistor is connected with the first terminal of the non-volatile memory cell 431. The second terminal of the drain/source terminal of the non-volatile memory cell 431 is connected with the output terminal O1.

For example, the neuron value with the logic value "1" is defined as an on voltage of the n-type transistor, and the neuron value with the logic value "0" is defined as an off voltage of the n-type transistor. In case that the neuron value has the logic value "1", the n-type transistor is turned on and the current is generated. Whereas, in case that the neuron value has the logic value "0", the n-type transistor is turned off and the current is not generated. For example, the on voltage is 3.3V, and the off voltage is equal to a ground voltage.

Similarly, the non-volatile memory cells 431~43m are MTP memory cells, OTP memory cells or Mask ROM cells. The non-volatile memory cells 431~43m of the multiply accumulate circuit 41 can store one-bit neuron connection weights w1,1~wm,1, respectively. When the non-volatile memory cell is in the off state, the resistance value is very large, and the current cannot flow through the non-volatile memory cell. Under this circumstance, the neuron connection weight is considered as the logic value "0". When the non-volatile memory cell is in the on state, the resistance value is lower, and the current can flow through the non-volatile memory cell. Under this circumstance, the neuron connection weight is considered as the logic value "1".

The output current Io1 from the output terminal O1 of the multiply accumulate circuit 41 in the application phase may be expressed by the following mathematic formula:

$$Io1 = \sum_{i=1}^{m} wi,1 \cdot Din\_i \cdot Iu$$

In the above mathematic formula, wi,1 and Din_i are one-bit binary codes.

Similarly, the output current Io2 from the output terminal O2 of the multiply accumulate circuit 42 in the application phase may be expressed by the following mathematic formula:

$$Io2 = \sum_{i=1}^{m} wi,2 \cdot Din\_i \cdot Iu$$

In the above mathematic formula, wi,2 is a one-bit binary code.

Similarly, the output current Ioj from the output terminal Oj of the multiply accumulate circuit 4j in the application phase may be expressed by the following mathematic formula:

$$Ioj = \sum_{i=1}^{m} wi,j \cdot Din\_i \cdot Iu$$

In the above mathematic formula, wi,j is a one-bit binary code.

The output terminals O1~Oj of the multiply accumulate circuits 41~4j are connected with corresponding converting circuits 491~49j, respectively. By the converting circuits 491~49j, the j output currents Io1~Ioj are converted into one-bit neuron values Dout_1~Dout_j for input to the next layer. For example, the converting circuits 491~49j are current comparators. For example, if the output current Io1 is higher than a reference current, the one-bit neuron value Dout_1 for input to of the next layer has the logic value "1". Whereas, if the output current Io1 is lower than the reference current, the one-bit neuron value Dout_1 for input to the next layer has the logic value "0".

Figure 5:
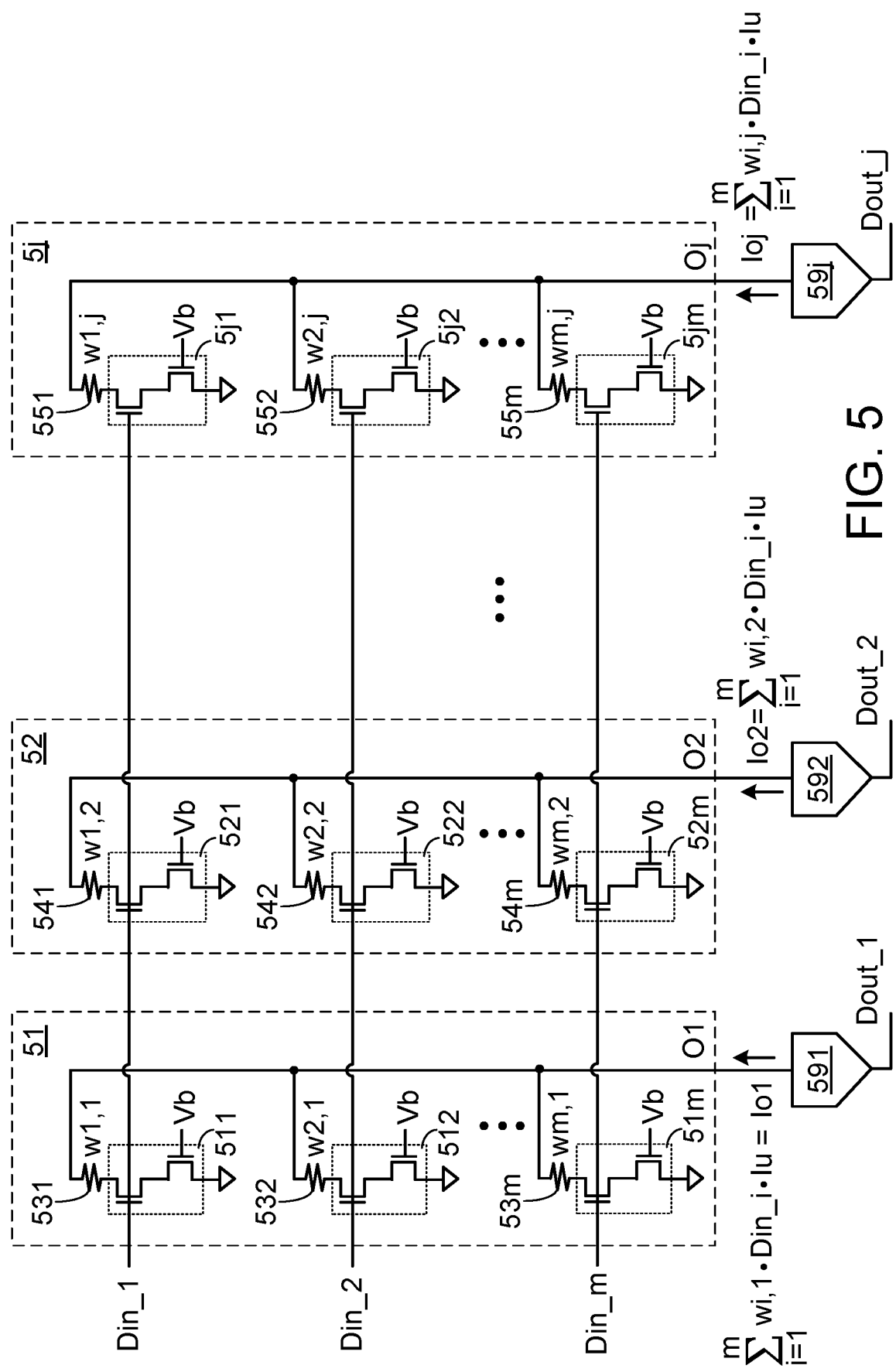
FIG. 5 is a schematic circuit diagram illustrating a MAC group with plural multiply accumulate circuits according to a third embodiment of the present invention.

FIG. 5 is a schematic circuit diagram illustrating a MAC group with plural multiply accumulate circuits according to a third embodiment of the present invention. The MAC group comprises j multiply accumulate circuits 51~5j. The multiply accumulate circuits 51~5j generate corresponding output currents Io1~Ioj, respectively. The circuitry structures of the multiply accumulate circuits 51~5j are identical. For brevity, only the multiply accumulate circuits 51 will be described.

The multiply accumulate circuit 51 comprises m current sources 511~51m and m non-volatile memory cells 531~53m. The m input terminals of the multiply accumulate circuit 51 receive m one-bit neuron values Din_1~Din_m of the previous layer, respectively. In addition, the m current sources 511~51m are controlled according to the m neuron values Din_1~Din_m. The multiply accumulate circuit 51 comprises m current paths. Each current path is defined by one current source and the corresponding non-volatile memory cell. The connecting relationships between these m current paths are similar to those of the multiply accumulate circuit 300 of the first embodiment, and not redundantly described herein.

In comparison with the second embodiment, the structure of the current source in the embodiment is distinguished. Hereinafter, the current source 511 will be described. The current source 511 comprises a switching transistor and a bias transistor, which are n-type transistors. The gate terminal of the bias transistor receives a bias voltage Vb. The first drain/source terminal of the bias transistor receives a first supply voltage. The second drain/source terminal of the bias transistor is connected with the first drain/source terminal of the switching transistor. The second drain/source terminal of the switching transistor is connected with the first terminal of the non-volatile memory cell 531. The gate terminal of the switching transistor receives the one-bit neuron value Din_1.

In this embodiment, the sizes of the bias transistors of the current sources 511~51m are identical. When any of the current sources 511~51m is activated, a current Iu is generated.

For example, the neuron value with the logic value "1" is defined as an on voltage of the switching transistor, and the neuron value with the logic value "0" is defined as an off voltage of the switching transistor. In case that the neuron value has the logic value "1", the switching transistor is turned on. Consequently, the current source is activated, and the current is generated. Whereas, in case that the neuron value has the logic value "0", the switching transistor is turned off. Consequently, the current source is inactivated, and the current is not generated. For example, the on voltage is 3.3V, and the off voltage is equal to a ground voltage.

The output current Io1 from the output terminal O1 of the multiply accumulate circuit 51 in the application phase may be expressed by the following mathematic formula:

$$Io1 = \sum_{i=1}^{m} wi,1 \cdot Din\_i \cdot Iu$$

In the above mathematic formula, wi,1 and Din_i are one-bit binary codes.

Similarly, the output current Io2 from the output terminal O2 of the multiply accumulate circuit 52 in the application phase may be expressed by the following mathematic formula:

$$Io2 = \sum_{i=1}^{m} wi,2 \cdot Din\_i \cdot Iu$$

In the above mathematic formula, wi,2 is a one-bit binary code.

Similarly, the output current Ioj from the output terminal Oj of the multiply accumulate circuit 5j in the application phase may be expressed by the following mathematic formula:

$$Ioj = \sum_{i=1}^{m} wi, j \cdot \text{Din\_i} \cdot Iu$$

In the above mathematic formula, wi,j is a one-bit binary code.

The output terminals O1~Oj of the multiply accumulate circuits 51~5j are connected with corresponding converting circuits 591~59j, respectively. By the converting circuits 591~59j, the j output currents Io1~Ioj are converted into one-bit neuron values Dout_1~Dout_j for input to the next layer. For example, the converting circuits 591~59j are current comparators. For example, if the output current Io1 is higher than a reference current, the one-bit neuron value Dout_1 for input to the next layer has the logic value "1". Whereas, if the output current Io1 is lower than the reference current, the one-bit neuron value Dout_1 for input to the next layer has the logic value "0".

In some embodiments, the current sources of the multiply accumulate circuit are implemented with p-type transistors.

Figure 6:
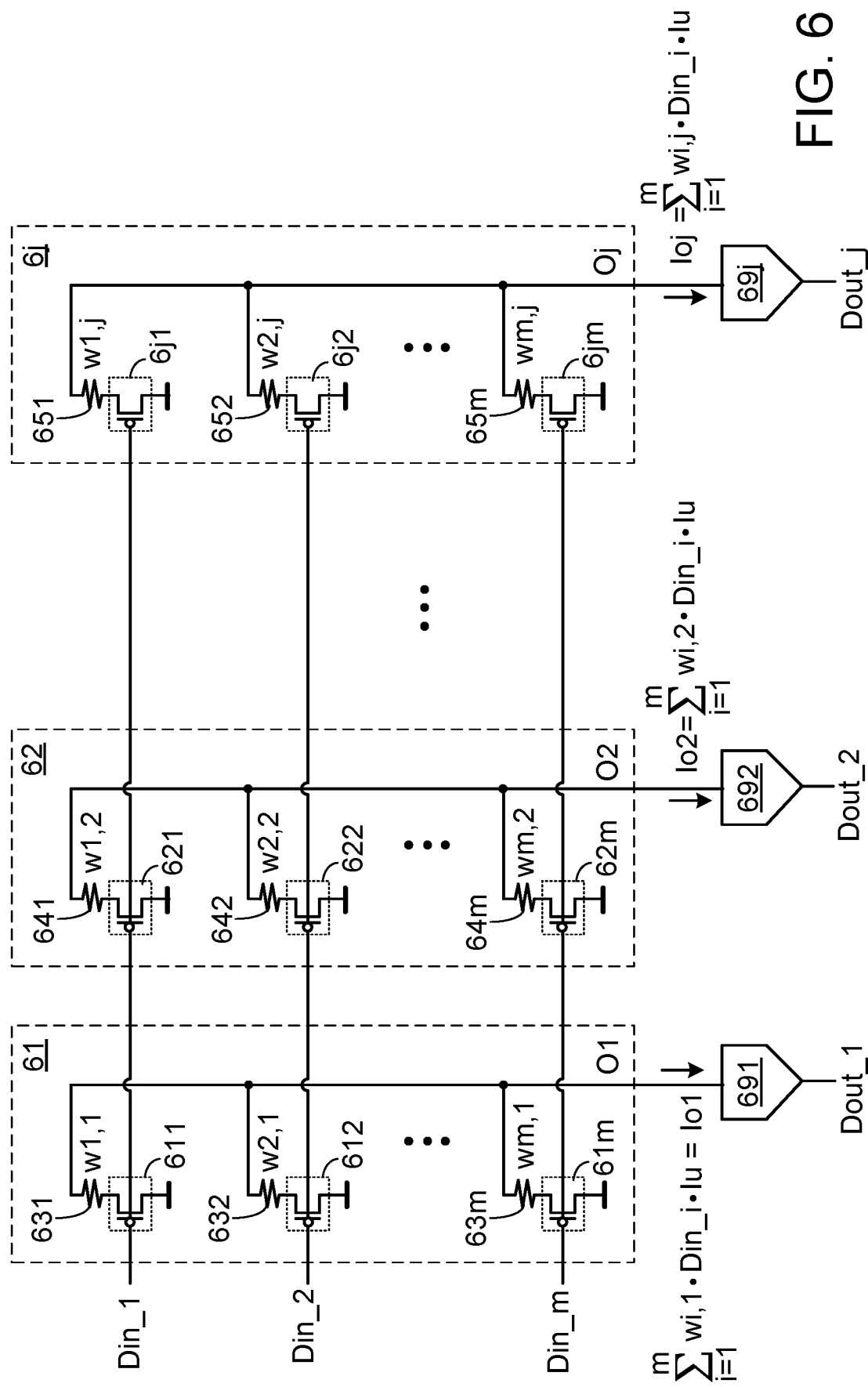
FIG. 6 is a schematic circuit diagram illustrating a MAC group with plural multiply accumulate circuits according to a fourth embodiment of the present invention.

FIG. 6 is a schematic circuit diagram illustrating a MAC group with plural multiply accumulate circuits according to a fourth embodiment of the present invention. The MAC group comprises j multiply accumulate circuits 61~6j. The multiply accumulate circuits 61~6j generate corresponding output currents Io1~Ioj, respectively. The circuitry structures of the multiply accumulate circuits 61~6j are identical. For brevity, only the multiply accumulate circuits 61 will be described.

The multiply accumulate circuit 61 comprises m current sources 611~61m and m non-volatile memory cells 631~63m. The m input terminals of the multiply accumulate circuit 61 receive m one-bit neuron values Din_1~Din_m of the previous layer, respectively. In addition, the m current sources 611~61m are controlled according to the m neuron values Din_1~Din_m. The multiply accumulate circuit 61 comprises m current paths. Each current path is defined by one current source and the corresponding non-volatile memory cell. The connecting relationships between these m current paths are similar to those of the multiply accumulate circuit 300 of the first embodiment, and not redundantly described herein.

In this embodiment, the current sources 611~61m of the multiply accumulate circuit 61 are implemented with p-type transistors. The sizes of the p-type transistors are identical. When any of the p-type transistors is turned on, a current Iu is generated.

In the current source 611, the gate terminal of the p-type transistor receives the one-bit neuron value Din_1, the first drain/source terminal of the p-type transistor receives the first supply voltage, and the second drain/source terminal of the p-type transistor is connected with the first terminal of the non-volatile memory cell 631. The second terminal of the drain/source terminal of the non-volatile memory cell 631 is connected with the output terminal O1.

For example, the neuron value with the logic value "1" is defined as an on voltage of the p-type transistor, and the neuron value with the logic value "0" is defined as an off voltage of the p-type transistor. In case that the neuron value has the logic value "1", the p-type transistor is turned on and the current is generated. Whereas, in case that the neuron value has the logic value "0", the p-type transistor is turned off and the current is not generated. For example, the first supply voltage is 3.3V, the off voltage is 3.3V, and the on voltage is equal to a ground voltage.

Similarly, the non-volatile memory cells 631~63m are MTP memory cells, OTP memory cells or Mask ROM cells. The non-volatile memory cells 631~63m of the multiply accumulate circuit 61 can store one-bit neuron connection weights w1,1~wm,1, respectively. When the non-volatile memory cell is in the off state, the resistance value is very large, and the current cannot flow through the non-volatile memory cell. Under this circumstance, the neuron connection weight is considered as the logic value "0". When the non-volatile memory cell is in the on state, the resistance value is lower, and the current can flow through the non-volatile memory cell. Under this circumstance, the neuron connection weight is considered as the logic value "1".

The output current Io1 from the output terminal O1 of the multiply accumulate circuit 61 in the application phase may be expressed by the following mathematic formula:

$$Io1 = \sum_{i=1}^{m} wi, 1 \cdot \text{Din\_i} \cdot Iu$$

In the above mathematic formula, wi,1 and Din_i are one-bit binary codes.

Similarly, the output current Io2 from the output terminal O2 of the multiply accumulate circuit 62 in the application phase may be expressed by the following mathematic formula:

$$Io2 = \sum_{i=1}^{m} wi, 2 \cdot \text{Din\_i} \cdot Iu$$

In the above mathematic formula, wi,2 is a one-bit binary code.

Similarly, the output current Ioj from the output terminal Oj of the multiply accumulate circuit 6j in the application phase may be expressed by the following mathematic formula:

$$Ioj = \sum_{i=1}^{m} wi, j \cdot \text{Din\_i} \cdot Iu$$

In the above mathematic formula, wi,j is a one-bit binary code.

The output terminals O1~Oj of the multiply accumulate circuits 61~6j are connected with corresponding converting circuits 691~69j, respectively. By the converting circuits 691~69j, the j output currents Io1~Ioj are converted into one-bit neuron values Dout_1~Dout_j for input to the next layer. For example, the converting circuits 691~69j are current comparators. For example, if the output current Io1 is higher than a reference current, the one-bit neuron value Dout_1 for input to of the next layer has the logic value "1". Whereas, if the output current Io1 is lower than the reference current, the one-bit neuron value Dout_1 for input to the next layer has the logic value "0".

Figure 7:
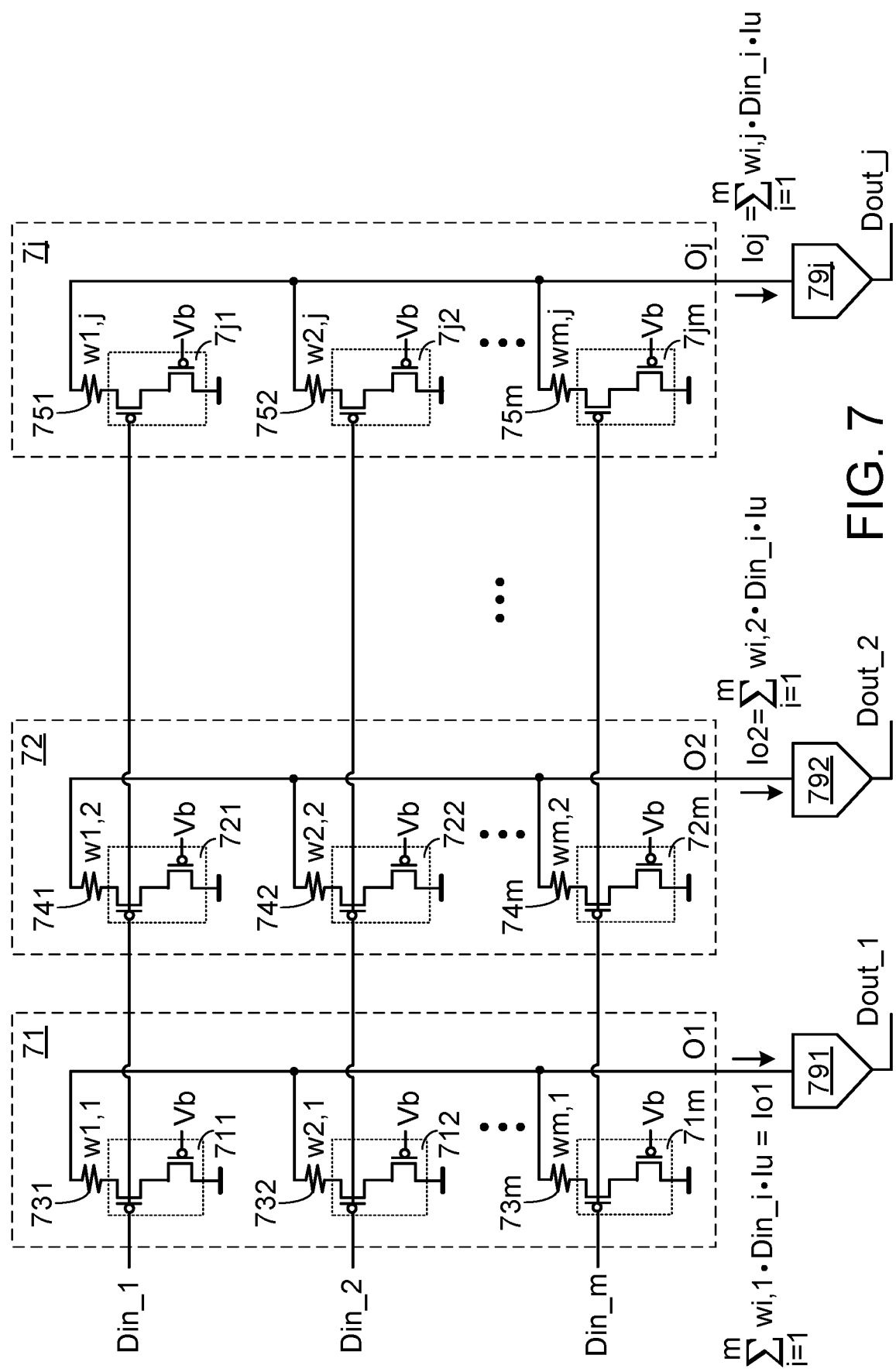
FIG. 7 is a schematic circuit diagram illustrating a MAC group with plural multiply accumulate circuits according to a fifth embodiment of the present invention.

FIG. 7 is a schematic circuit diagram illustrating a MAC group with plural multiply accumulate circuits according to a fifth embodiment of the present invention. The MAC group comprises j multiply accumulate circuits 71~7j. The multiply accumulate circuits 71~7j generate corresponding output currents Io1~Ioj, respectively. The circuitry structures of the multiply accumulate circuits 71~7j are identical. For brevity, only the multiply accumulate circuits 71 will be described.

The multiply accumulate circuit 71 comprises m current sources 711~71m and m non-volatile memory cells 731~73m. The m input terminals of the multiply accumulate circuit 71 receive m one-bit neuron values Din_1~Din_m of the previous layer, respectively. In addition, the m current sources 711~71m are controlled according to the m neuron values Din_1~Din_m. The multiply accumulate circuit 71 comprises m current paths. Each current path is defined by one current source and the corresponding non-volatile memory cell. The connecting relationships between these m current paths are similar to those of the multiply accumulate circuit 300 of the first embodiment, and not redundantly described herein.

In comparison with the fourth embodiment, the structure of the current source in the embodiment is distinguished. Hereinafter, the current source 711 will be described. The current source 711 comprises a switching transistor and a bias transistor, which are p-type transistors. The gate terminal of the bias transistor receives a bias voltage Vb. The first drain/source terminal of the bias transistor receives a first supply voltage. The second drain/source terminal of the bias transistor is connected with the first drain/source terminal of the switching transistor. The second drain/source terminal of the switching transistor is connected with the first terminal of the non-volatile memory cell 731. The gate terminal of the switching transistor receives the one-bit neuron value Din_1.

In this embodiment, the sizes of the bias transistors of the current sources 711~71m are identical. When any of the current sources 711~71m is activated, a current Iu is generated.

For example, the neuron value with the logic value "1" is defined as an on voltage of the switching transistor, and the neuron value with the logic value "0" is defined as an off voltage of the switching transistor. In case that the neuron value has the logic value "1", the switching transistor is turned on. Consequently, the current source is activated, and the current is generated. Whereas, in case that the neuron value has the logic value "0", the switching transistor is turned off. Consequently, the current source is inactivated, and the current is not generated. For example, the first supply voltage is 3.3V, the off voltage is 3.3V, and the on voltage is equal to a ground voltage.

The output current Io1 from the output terminal O1 of the multiply accumulate circuit 71 in the application phase may be expressed by the following mathematic formula:

$$Io1 = \sum_{i=1}^{m} wi,1 \cdot \text{Din\_i} \cdot Iu$$

In the above mathematic formula, wi,1 and Din_i are one-bit binary codes.

Similarly, the output current Io2 from the output terminal O2 of the multiply accumulate circuit 72 in the application phase may be expressed by the following mathematic formula:

$$Io2 = \sum_{i=1}^{m} wi,2 \cdot \text{Din\_i} \cdot Iu$$

In the above mathematic formula, wi,2 is a one-bit binary code.

Similarly, the output current Ioj from the output terminal Oj of the multiply accumulate circuit 7j in the application phase may be expressed by the following mathematic formula:

$$Ioj = \sum_{i=1}^{m} wi,j \cdot \text{Din\_i} \cdot Iu$$

In the above mathematic formula, wi,j is a one-bit binary code.

The output terminals O1~Oj of the multiply accumulate circuits 71~7j are connected with corresponding converting circuits 791~79j, respectively. By the converting circuits 791~79j, the j output currents Io1~Ioj are converted into one-bit neuron values Dout_1~Dout_j for input to the next layer. For example, the converting circuits 791~79j are current comparators. For example, if the output current Io1 is higher than a reference current, the one-bit neuron value Dout_1 for input to the next layer has the logic value "1". Whereas, if the output current Io1 is lower than the reference current, the one-bit neuron value Dout_1 for input to the next layer has the logic value "0".

From the above descriptions, the present invention provides a multiply accumulate circuit for a binary neural network system. In each current path of the multiply accumulate circuit, the non-volatile memory cell stores the one-bit neuron connection weight, and the current source is controlled according to the one-bit neuron of the previous layer. Consequently, the non-volatile memory cells and the current sources are applied to the multiply accumulate circuit for the binary neural network system.

The technology of the present invention may be further modified. In some other embodiments, the present invention provides a multiply accumulate circuit for a multi-bit neural network system.

Figure 8:
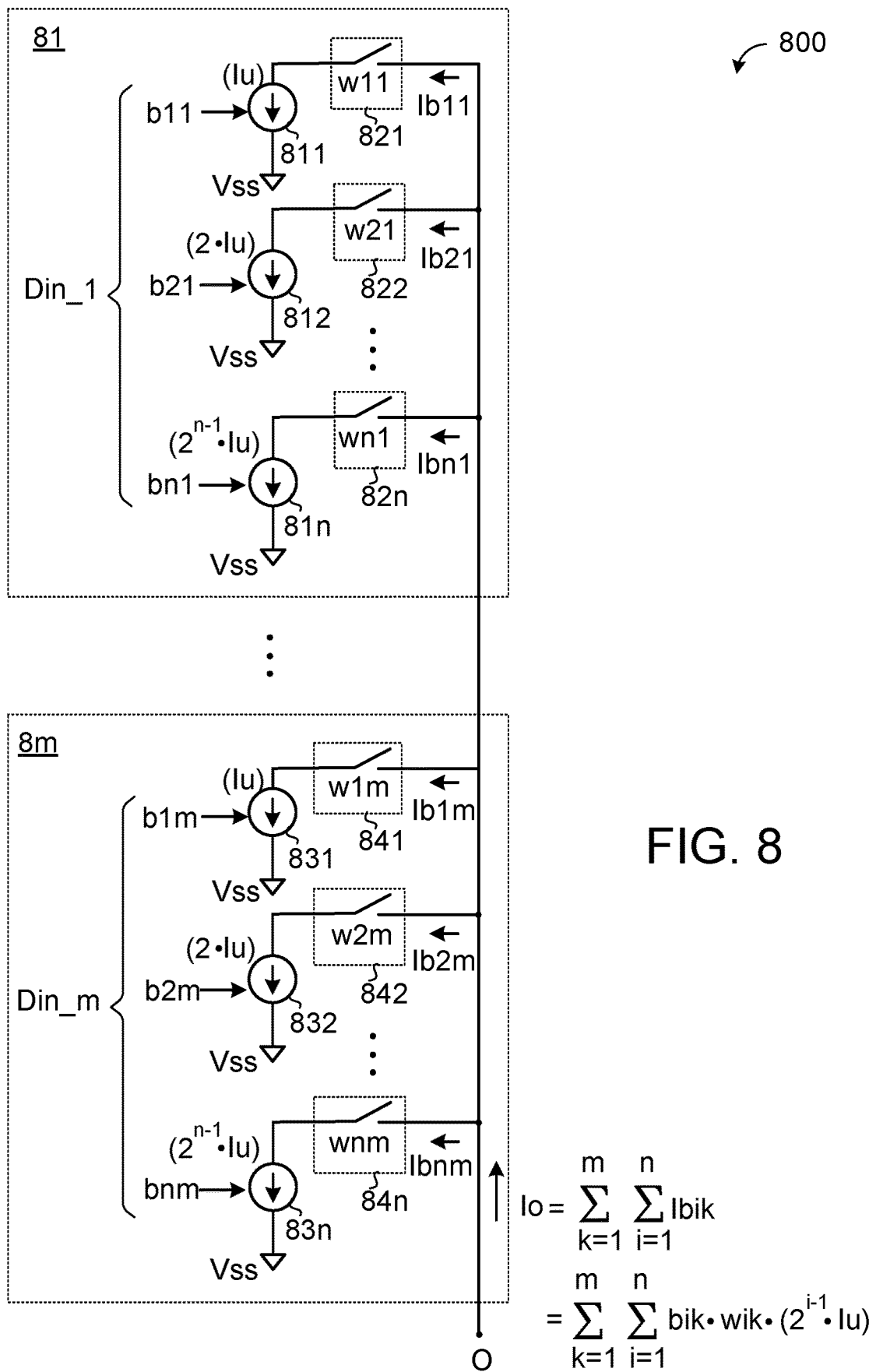
FIG. 8 is a schematic circuit diagram illustrating a multiply accumulate circuit for a multi-bit neural network system according to an embodiment of the present invention.

FIG. 8 is a schematic circuit diagram illustrating a multiply accumulate circuit for a multi-bit neural network system according to an embodiment of the present invention. The multiply accumulate circuit 800 comprises m sub-multiply accumulate circuits 81~8m. The sub-multiply accumulate circuits 81~8m receive the neuron values Din_1~Din_m of the previous layer, respectively. Each of the neuron values Din_1~Din_m is an n-bit binary code, wherein n is larger than 1.

The circuitry structures of the sub-multiply accumulate circuits 81~8m are identical. For brevity, only the sub-multiply accumulate circuit 81 will be described. The sub-multiply accumulate circuit 81 comprises n current sources 811~81n and n non-volatile memory cells 821~82n. The neuron value Din_1 of the previous layer has n bits b11~bn1. The n input terminals of the sub-multiply accumulate circuit 81 receive the n bits b11~bn1 of the neuron value Din_1, respectively. Moreover, the n current sources 811~81n are controlled according to the n bits b11~bn1 of the neuron value Din_1.

The non-volatile memory cells 821~82n can store one-bit neuron connection weights w11~wn1, respectively. In other words, the non-volatile memory cells 821~82n can store n-bits neuron connection weights. The non-volatile memory cells 821~82n are MTP memory cells, OTP memory cells or Mask ROM cells.

The sub-multiply accumulate circuit 81 comprises n current paths. These current paths are connected between the first supply voltage Vss and the output terminal O in parallel. Each current path is defined by one current source and the corresponding non-volatile memory cell. The current source 811 of the first current path is controlled according to the least significant bit (LSB) b11 of the neuron value Din_1. The current source 812 of the second current path is controlled according to the second least bit b21. The rest may be deduced by analog. The current source 81n of the n-th current path is controlled according to the most significant bit (MSB) bn1 of the neuron value Din_1.

In an embodiment, the magnitudes of the current sources 811~81n are related to the order of the bits of the of the neuron value Din_1. For example, according to the bit b11 of the neuron value Din_1, the magnitude of the current generated by the current source 811 is Iu. According to the bit b21 of the neuron value Din_1, the magnitude of the current generated by the current source 812 is 2×Iu. According to the bit bn1 of the neuron value Din_1, the magnitude of the current generated by the current source 81n is $2^{n-1}$×Iu.

In an application phase of the multiply accumulate circuit 800, the output terminal O of the multiply accumulate circuit 800 receives a second supply voltage Vdd. The magnitude of the second supply voltage Vdd is higher than the magnitude of the first supply voltage Vss.

In the application phase of the multiply accumulate circuit 800, the output terminal O of the multiply accumulate circuit 800 generates an output current $I_0$ according to the m one-bit neuron values Din_1~Din_m of the previous layer and the one-bit neuron connection weights w11~n1 to w1m~wnm in the non-volatile memory cells 821~82n to 841~84n.

The output current $I_0$ from the output terminal O of the multiply accumulate circuit 81 in the application phase may be expressed by the following mathematic formula:

$$Io = \sum_{k=1}^{m}\sum_{i=1}^{n} Ibik = \sum_{k=1}^{m}\sum_{i=1}^{n} bik \cdot wik \cdot (2^{i-1} \cdot Iu)$$

By an analog-to-digital converter (ADC), the output current $I_0$ is converted into an n-bit neuron value for input to the next layer.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A multiply accumulate circuit for a neural network system comprising m sub-multiply accumulate circuits, and a first sub-multiply accumulate circuit of the m sub the multiply accumulate circuits comprising:
   n non-volatile memory cells; and
   n current sources,
   wherein the first sub-multiply accumulate circuit receives n one-bit neuron values from a first layer of the neural network system;
   wherein n current paths are defined by the n non-volatile memory cells and the n current sources collaboratively, and the n current paths are connected between a first supply voltage and an output terminal of the first sub-multiply accumulate circuit,
   wherein a first current path of the n current paths is defined by a first non-volatile memory cell of the n non-volatile memory cells and a first current source of the n current sources, the first non-volatile memory cell of the n non-volatile memory cells and the first current source of the n current sources are connected in series between the first supply voltage and the output terminal of the first sub-multiply accumulate circuit, and a control terminal of the first current source receives a first one-bit neuron value of the n one-bit neuron values from the first layer,
   wherein the first current source of the n current sources is capable of providing a first current, a x'th current source of the n current sources is capable of providing a xth current, a magnitude of the xth current is equal to $2^{(x-1)}$ times of a magnitude of the first current, m and n and x are integers, x is greater than 1, and x is less than or equal to n,
   wherein when the first non-volatile memory cell is in a first storage state corresponding to a high resistance value, a one-bit neuron connection weight stored in the first non-volatile memory cell has a first logic value, wherein when the first non-volatile memory cell is in a second storage state corresponding to a low resistance value, the one-bit neuron connection weight stored in the first non-volatile memory cell has a second logic value, and wherein the high resistance value is at least 1000 times the low resistance value.

2. The multiply accumulate circuit as claimed in claim 1, wherein the n non-volatile memory cells are multi-time programming memory cells, one time programming memory cells or mask read only memory cells, wherein n one-bit neuron connection weights are stored in the n non-volatile memory cells, respectively.

3. The multiply accumulate circuit as claimed in claim 1, wherein the first logic value is a logic value "0", and the second logic value is a logic value "1".

4. The multiply accumulate circuit as claimed in claim 1, wherein in the application phase, the n current paths are controlled by the first sub-multiply accumulate circuit according to the n m one-bit neuron values from the first layer, so that an output current is outputted from the output terminal of the first sub-multiply accumulate circuit.

5. The multiply accumulate circuit as claimed in claim 4, wherein the multiply accumulate circuit further comprises a converting circuit for converting a sum of m output currents from the m sub-multiply accumulate circuits into a second neuron value for input to a second layer of the neural network system.

6. The multiply accumulate circuit as claimed in claim 1, wherein a first terminal of the first current source receives the first supply voltage, a second terminal of the first current source is connected with a first terminal of the first non-volatile memory cell, a second terminal of the first non-volatile memory cell is connected with the output terminal of the first sub-multiply accumulate circuit.

7. The multiply accumulate circuit as claimed in claim 6, wherein the first current path does not output the first current when the one-bit neuron connection weight stored in the first non-volatile memory cell has the first logic value or the first one-bit neuron value of the n one-bit neuron values is a logic value "0", and the first current path outputs the first current when the one-bit neuron connection weight stored in the first non-volatile memory cell has the second logic value and the first one-bit neuron value of the n one-bit neuron values is a logic value "1".

8. The multiply accumulate circuit as claimed in claim 1, wherein the first current source comprises a transistor, wherein a gate terminal of the transistor receives the first one-bit neuron value, a first drain/source terminal of the transistor receives the first supply voltage, and a second drain/source terminal of the transistor is connected with the first terminal of the first non-volatile memory cell.

9. The multiply accumulate circuit as claimed in claim 8, wherein the transistor is a p-type transistor or an n-type transistor.

10. The multiply accumulate circuit as claimed in claim 1, wherein the first current source comprises a bias transistor and a switching transistor, wherein a gate terminal of the bias transistor receives a bias voltage, a first drain/source terminal of the bias transistor receives the first supply voltage, a second drain/source terminal of the bias transistor is connected with a first drain/source terminal of the switching transistor, a second drain/source terminal of the switching transistor is connected with the first terminal of the first non-volatile memory cell, and a gate terminal of the switching transistor receives the first one-bit neuron value.

11. The multiply accumulate circuit as claimed in claim 10, wherein the bias transistor and the switching transistor are p-type transistors or n-type transistors.

* * * * *